United States Patent
Fujiwara et al.

(10) Patent No.: US 8,575,744 B2
(45) Date of Patent: Nov. 5, 2013

(54) SEMICONDUCTOR DEVICE AND LEAD FRAME THEREOF

(75) Inventors: Seiji Fujiwara, Kyoto (JP); Zhuoyan Sun, Osaka (JP); Atsushi Watanabe, Osaka (JP)

(73) Assignee: Panasonic Corporation, Osaka (JP)

(*) Notice: Subject to any disclaimer, the term of this patent is extended or adjusted under 35 U.S.C. 154(b) by 263 days.

(21) Appl. No.: 12/939,000

(22) Filed: Nov. 3, 2010

(65) Prior Publication Data

US 2011/0121440 A1 May 26, 2011

(30) Foreign Application Priority Data

Nov. 20, 2009 (JP) .................................. 2009-265351
Sep. 16, 2010 (JP) .................................. 2010-207902

(51) Int. Cl.
*H01L 23/495* (2006.01)

(52) U.S. Cl.
USPC .... 257/692; 257/675; 257/676; 257/E21.505; 257/E23.032; 257/E23.043

(58) Field of Classification Search
USPC ........................................................ 257/692
See application file for complete search history.

(56) References Cited

U.S. PATENT DOCUMENTS

| | | | |
|---|---|---|---|
| 5,608,237 A * | 3/1997 | Aizawa et al. | 257/132 |
| 7,375,424 B2 * | 5/2008 | Connah | 257/692 |
| 7,547,964 B2 * | 6/2009 | Pavier et al. | 257/691 |
| 7,745,930 B2 * | 6/2010 | Connah et al. | 257/728 |
| 2005/0140014 A1 * | 6/2005 | Urushido | 257/773 |
| 2005/0151236 A1 * | 7/2005 | Oliver et al. | 257/685 |
| 2006/0151858 A1 * | 7/2006 | Ahn et al. | 257/666 |
| 2006/0249831 A1 | 11/2006 | Connah | |
| 2006/0261473 A1 | 11/2006 | Connah et al. | |
| 2009/0058500 A1 | 3/2009 | Osawa et al. | |
| 2009/0072367 A1 * | 3/2009 | Poddar et al. | 257/676 |
| 2009/0206363 A1 * | 8/2009 | Machida et al. | 257/133 |
| 2009/0236705 A1 * | 9/2009 | Chou et al. | 257/675 |
| 2012/0038033 A1 * | 2/2012 | Oga et al. | 257/659 |
| 2012/0217542 A1 * | 8/2012 | Morita | 257/140 |

FOREIGN PATENT DOCUMENTS

JP 2008-541435 11/2008

\* cited by examiner

*Primary Examiner* — Calvin Lee
*Assistant Examiner* — Abul Kalam
(74) *Attorney, Agent, or Firm* — McDermott Will & Emery LLP (57) ABSTRACT

A semiconductor device includes a semiconductor element and a lead frame. The lead frame includes a first lead, a second lead, a third lead, a fourth lead, and a fifth lead placed parallel to one another. The first and second leads are placed adjoining to each other and constitute a first lead group, and the third and fourth leads are placed adjoining to each other and constitute a second lead group. The spacing between the first lead group and the fifth lead, the spacing between the second lead group and the fifth lead, and the spacing between the first lead group and the second lead group are larger than the spacing between the first lead and the second lead and the spacing between the third lead and the fourth lead.

17 Claims, 7 Drawing Sheets

SEMICONDUCTOR DEVICE AND LEAD FRAME THEREOF

CROSS-REFERENCE TO RELATED APPLICATION

This application claims priority to Japanese Patent Application No. 2009-265351 filed on Nov. 20, 2009 and Japanese Patent Application No. 2010-207902 filed on Sep. 16, 2010, the disclosure of which including the specifications, the drawings, and the claims is hereby incorporated by reference in its entirety.

BACKGROUND

The present disclosure relates to semiconductor devices and lead frames, and more particularly to bidirectionally switchable semiconductor devices and lead frames thereof.

Figure 11:
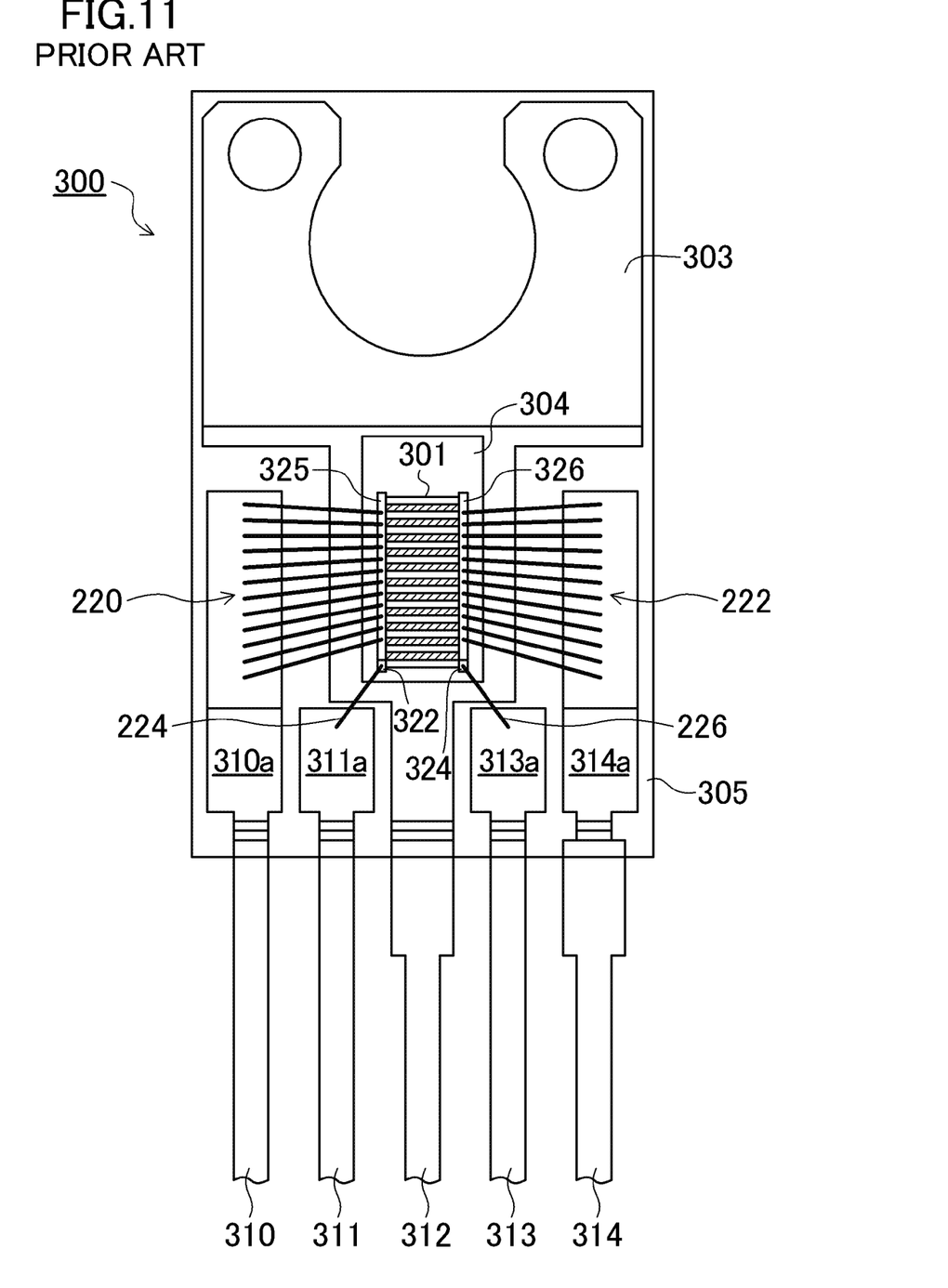
FIG. 11 is a plan view of a conventional semiconductor device.

It is known that a package of a nitride-based power semiconductor element has a configuration as shown in FIG. 11 (see Japanese Translation of PCT International Application No. 2008-541435 (WO 2006/119485), for example). As shown in FIG. 11, a semiconductor device 300 includes a lead frame. The lead frame has a die pad 304 that is integral with a header 303, and also has lead terminals 310-314 that extend from the same edge of the semiconductor device 300 beyond the periphery of a protective housing 305. The lead terminal 312 is integral with the die pad 304. The protective housing 305 covers portions of the top and bottom surfaces of the lead frame.

The semiconductor device 300 also includes a semiconductor element 301 mounted on the die pad 304. The semiconductor element 301 is a nitride-based bidirectional switching element having an elongate plane shape, which has a first power terminal 325, a second power terminal 326, a first control terminal 322, and a second control terminal 324. The first power terminal 325 is connected to a bonding pad 310a that is integral with the lead terminal 310 via a plurality of wires 220. The second power terminal 326 is connected to a bonding pad 314a that is integral with the lead terminal 314 via a plurality of wires 222. The first control terminal 322 is connected to a bonding pad 311a that is integral with the lead terminal 311 via a wire 224. The second control terminal 324 is connected to a bonding pad 313a that is integral with the lead terminal 313 via a wire 226.

The bonding pads 310a and 314a respectively extend parallel to the first and second power terminals 325 and 326 of the semiconductor element 301, whereby the plurality of wires 220, and the plurality of wires 222, can be substantially parallel to each other and of substantially the same length.

Having substantially the same length, the plurality of wires 220, and the plurality of wires 222, have substantially the same resistance, permitting uniform current flow. Also, by configuring the bonding pads 310a and 314a to be elongate along the first and second power terminals 325 and 326, respectively, the wires 220 and the wires 222 can be short in length. This permits reduction in the electric resistance and inductance of the packaged elements and also reduction in cost.

SUMMARY

The conventional semiconductor device described above has a problem that a number of wires are necessary. In particular, when a large current is required, the number of wires must be increased to ensure that the device can endure a fusing current. With the increased number of wires, the size of the bonding pads for wire bonding must be increased, and this makes it difficult to reduce the size of the semiconductor device.

The dielectric strength of a semiconductor device depends on the positional relationship between lead terminals. In the conventional semiconductor device, in which limits are placed on the spacing between the lead terminals, it is difficult to improve the dielectric strength.

It is an objective of the present disclosure to implement a small-sized semiconductor device that satisfies clearances required to secure the dielectric strength and allows flow of a large current.

To attain the above objective, an example semiconductor device has a positional relationship between lead terminals that satisfies clearances required to secure the dielectric strength.

Specifically, the example semiconductor device includes: a semiconductor element including a first terminal, a second terminal, a third terminal, and a fourth terminal formed on a terminal formation surface and a back terminal formed on a surface opposite to the terminal formation surface; and a lead frame including a die pad having an element mount surface on which the semiconductor element is mounted and a first lead, a second lead, a third lead, a fourth lead, and a fifth lead placed parallel to one another, wherein the first lead is connected to the first terminal, the second lead is connected to the second terminal, the third lead is connected to the third terminal, the fourth lead is connected to the fourth terminal, the fifth lead is connected to the back terminal via the die pad, the first lead and the second lead are placed adjoining to each other and constitute a first lead group, the third lead and the fourth lead are placed adjoining to each other and constitute a second lead group, and the spacing between the first lead group and the fifth lead, the spacing between the second lead group and the fifth lead, and the spacing between the first lead group and the second lead group are larger than the spacing between the first lead and the second lead and the spacing between the third lead and the fourth lead.

In the example semiconductor device, the spacing between the first lead group and the fifth lead, the spacing between the second lead group and the fifth lead, and the spacing between the first lead group and the second lead group are larger than the spacing between the first lead and the second lead and the spacing between the third lead and the fourth lead. Therefore, since the minimum clearances between the fifth lead and the first and second lead groups can be increased, a small-sized semiconductor device having a high dielectric strength can be implemented.

DETAILED DESCRIPTION

Figure 1:
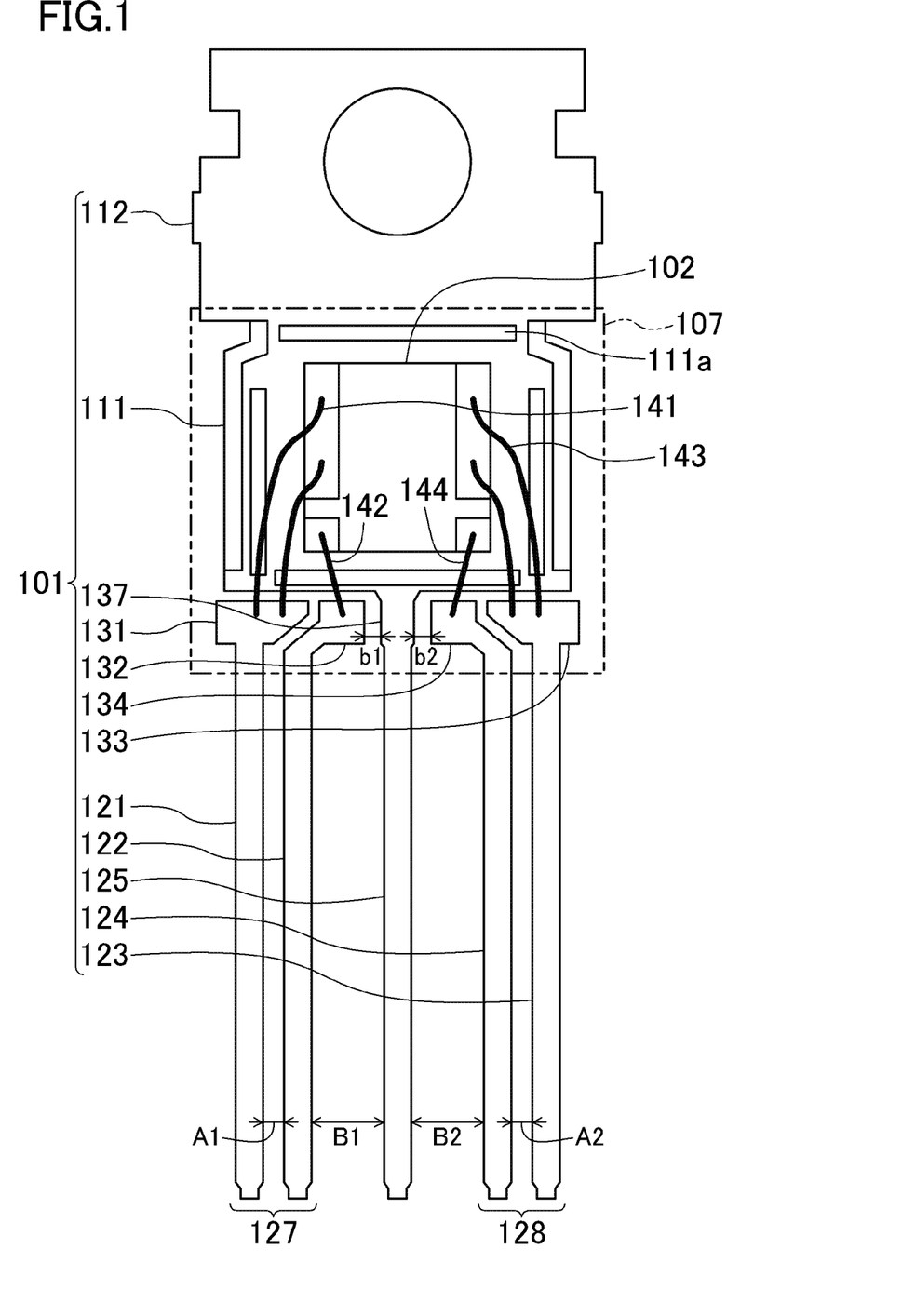
FIG. 1 is a plan view of a semiconductor device of an embodiment of the present invention.

As shown in FIG. 1, in an example semiconductor device, a semiconductor element 102 is mounted on a lead frame 101, and is sealed with a sealing member 107 made of resin. Note that only the position of the sealing member 107 is shown in FIG. 1.

Figure 2:
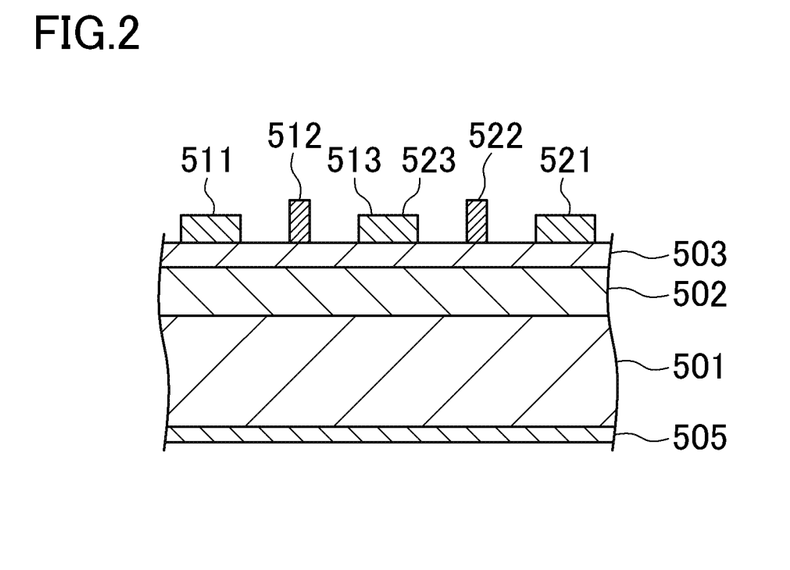
FIG. 2 is a cross-sectional view showing a configuration of a semiconductor element.

The semiconductor element 102 is a power switching element, for example. As a specific example, the element includes two field effect transistors (FETs) made of nitride semiconductors formed integrally on a substrate, as shown in FIG. 2. On a substrate 501, sequentially formed are a first nitride semiconductor layer 502 as a channel layer and a second nitride semiconductor layer 503 as an electron supply layer. The first nitride semiconductor layer 502 may be a gallium nitride (GaN) layer, for example, and the second nitride semiconductor layer 503 may be an aluminum gallium nitride (AlGaN) layer, for example, which is larger in bandgap than GaN. On the second nitride semiconductor layer 503, formed are a first drain electrode 511, a first gate electrode 512, a first source electrode 513, a second drain electrode 521, a second gate electrode 522, and a second source electrode 523. The first source electrode 513 and the second source electrode 523 share an electrode. Note however that formation of the first and second source electrodes 513 and 523 may be omitted.

Figure 3:
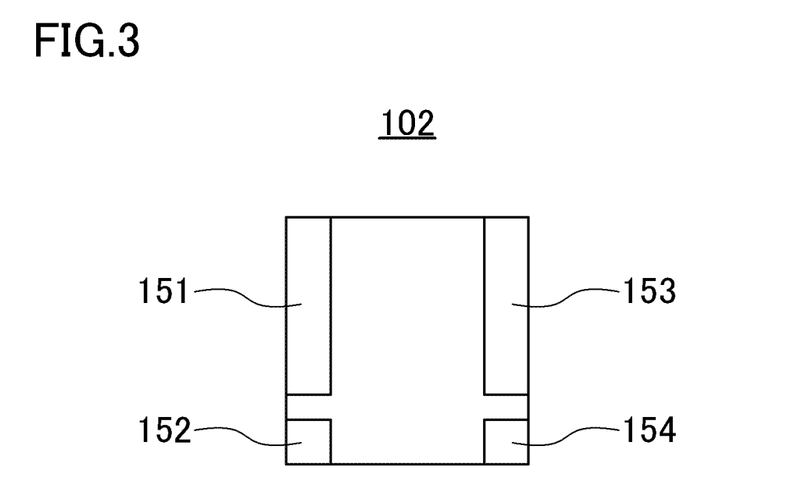
FIG. 3 is a plan view showing a configuration of the semiconductor element.

As shown in FIG. 3, on a terminal formation surface of the semiconductor element 102, formed are a first terminal 151 connected to the first drain electrode, a second terminal 152 connected to the first gate electrode, a third terminal 153 connected to the second drain electrode, and a fourth terminal 154 connected to the second gate electrode. A back terminal 505 is provided on the surface (back surface) of the semiconductor element opposite to the terminal formation surface, and connected to the first and second source electrodes. By providing a switch control section and applying a bias voltage to the second terminal 152 and the fourth terminal 154 based on the potential of the back terminal 501, the direction of a current flowing between the first terminal 151 and the third terminal 153 can be switched between the two opposite directions. Therefore, the first and third terminals 151 and 153 serve as power terminals of the bidirectional switch, and the second and fourth terminals 152 and 154 serve as control terminals of the bidirectional switch.

The first terminal 151 and the second terminal 152 are formed in a line along a first side of the terminal formation surface of the semiconductor element 102. Similarly, the third terminal 153 and the fourth terminal 154 are formed in a line along a second side opposite to the first side. In other words, the first and second terminals 151 and 152 and the third and fourth terminals 153 and 154 are formed on the opposite edges of the terminal formation surface of the semiconductor element axisymmetrically with respect to the centerline of the terminal formation surface. The size of the first and third terminals 151 and 153 may be determined with the diameter, number, etc. of wires bonded thereto. In this embodiment, the size was set to about 0.6 mm×1.0 mm.

The lead frame 101 includes a die pad 111 having an element mount surface on which the semiconductor element 102 is mounted, a first lead 121, a second lead 122, a third lead 123, a fourth lead 124, and a fifth lead 125. The die pad 111, which is integral with a heatsink 112, is made of a metal that easily dissipates heat, such as copper and tungsten, having a thickness of about 1.4 mm, and is given about 2 μm-thick semigloss nickel plating. In this embodiment, the die pad 111 has a groove 111a having a depth of about 0.1 mm formed to surround the region on which the semiconductor element 102 is mounted. Formation of the groove 111a increases the contact area of the die pad 111 with the sealing member 107. This provides an advantage of improving the adhesiveness of the die pad 111 to the sealing member 107, making the sealing member 107 more resistant to detachment. The groove 111a is not necessarily required to surround the semiconductor element-mounted region, but may be formed, in the region covered with the sealing member 107, to extend parallel to the boundary between the region covered with the sealing member 107 and the uncovered region. Alternatively, a plurality of grooves may be formed parallel to the boundary. Note however that formation of such grooves may be omitted. The die pad 111 is connected to the back terminal 505 of the semiconductor element 102 with a tin alloy solder material, etc.

The first to fifth leads 121-125 are made of a copper alloy having a width of about 0.7 mm and a thickness of about 0.6 mm and coated with lead-free solder. A first lead terminal 131 is formed, as a bonding pad, at the end of the first lead 121 closer to the die pad 111, and connected to the first terminal 151 via first wires 141. A second lead terminal 132 is formed at the end of the second lead 122 closer to the die pad 111, and connected to the second terminal 152 via a second wire 142. A third lead terminal 133 is formed at the end of the third lead 123 closer to the die pad 111, and connected to the third terminal 153 via third wires 143. A fourth lead terminal 134 is formed at the end of the fourth lead 124 closer to the die pad 111, and connected to the fourth terminal 154 via a fourth wire 144. The fifth lead 125 is formed integrally with the die pad 111 via a lead joint 137, and connected to the back terminal 505 of the semiconductor element 102 via the die pad 111.

Since the dielectric strength of the semiconductor device depends on the distances between the leads and the distances between the lead terminals, the positional relationship among the first to fifth leads 121-125 and among the first to fourth lead terminals 131-134 and the sizes thereof are important. In FIG. 1, a first lead group 127 including the first and second leads 121 and 122 is placed symmetrically with a second lead group 128 including the third and fourth leads 123 and 124 with respect to the fifth lead 125. Spacing B1 between the first lead group 127 and the fifth lead 125 and spacing B2 between the second lead group 128 and the fifth lead 125 are larger than spacing A1 between the first lead 121 and the second lead 122 and spacing A2 between the third lead 123 and the fourth lead 124. In FIG. 1, the spacing B1 is equal to the spacing B2, and the spacing A1 is equal to the spacing A2. Note that the spacing B1 refers to the spacing between the first lead 121 or the second lead 122 whichever is closer to the fifth lead 125 and the fifth lead 125, and the spacing B2 refers to the spacing between the third lead 123 or the fourth lead 124 whichever is closer to the fifth lead 125 and the fifth lead 125.

Specifically, the pitch between the first and second leads 121 and 122 and the pitch between the third and fourth leads 123 and 124 may be 1.27 mm, and the pitch between the first lead group 127 and the fifth lead 125 and the pitch between the second lead group 128 and the fifth lead 125 may be 2.54 mm. For example, when the second lead 122 is placed closer to the fifth lead 125 than the first lead 121 and the fourth lead 124 is placed closer to the fifth lead 125 than the third lead 123, the pitch between the fifth lead 125 and each of the second lead 122 and the fourth lead 124 is set to 2.54 mm. Also, the pitch between the fifth lead 125 and each of the first lead 121 and the third lead 123 is set to 3.81 mm. By this setting, the minimum clearance between each of the second lead 122 and the fourth lead 124 and the fifth lead 125 can be about 1.7 mm, and the minimum clearance between each of the first lead 121 and the third lead 123 and the fifth lead 125 can be about 2.97 mm.

Figure 4:
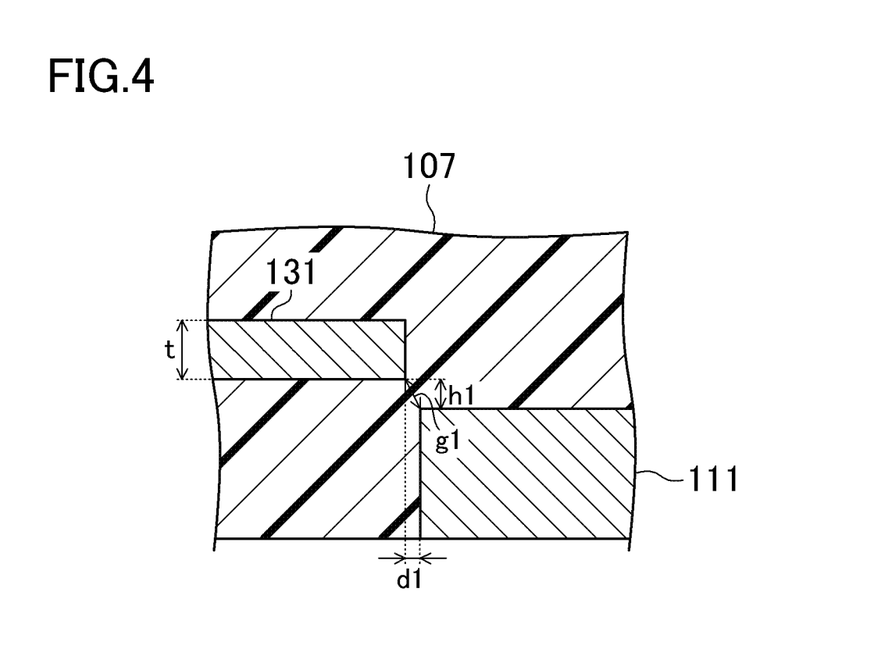
FIG. 4 is an enlarged cross-sectional view of a portion of a lead terminal.

It is preferred that spacing g between each of the first to fourth lead terminals 131-134 and the die pad 111 is as large as possible. Increasing the spacing between each of the first to fourth lead terminals 131-134 and the die pad 111 in the direction parallel to the element mount surface (horizontal direction) will result in increasing the size of the semiconductor device. Therefore, as shown in FIG. 4, it is preferable to place the leads and the die pad 111 on different planes, and setting spacing h1 between the first lead terminal 131 and the die pad 111 in the direction vertical to the element mount surface to be larger than spacing d1 between the first lead terminal 131 and the die pad 111 in the direction horizontal to the element mount surface. In this case, spacing g1 between the first lead terminal 131 and the die pad 111 is expressed by $g1=\sqrt{(h1^2+d1^2)}$. This also applies to the second to fourth lead terminals 132-134. The spacing d1 between the first lead terminal 131 and the die pad 111 in the horizontal direction is preferably larger than zero. This also applies to the second to fourth lead terminals 132-134. Having spacing larger than zero, it is easy to place a jig for wire bonding under the lead terminal. The spacing d1 can be substantially zero, but it is difficult, from the standpoint of the lead frame formation process, to allow the lead terminal to overlap the die pad in the horizontal position with the spacing d1 being less than zero.

Figure 5:
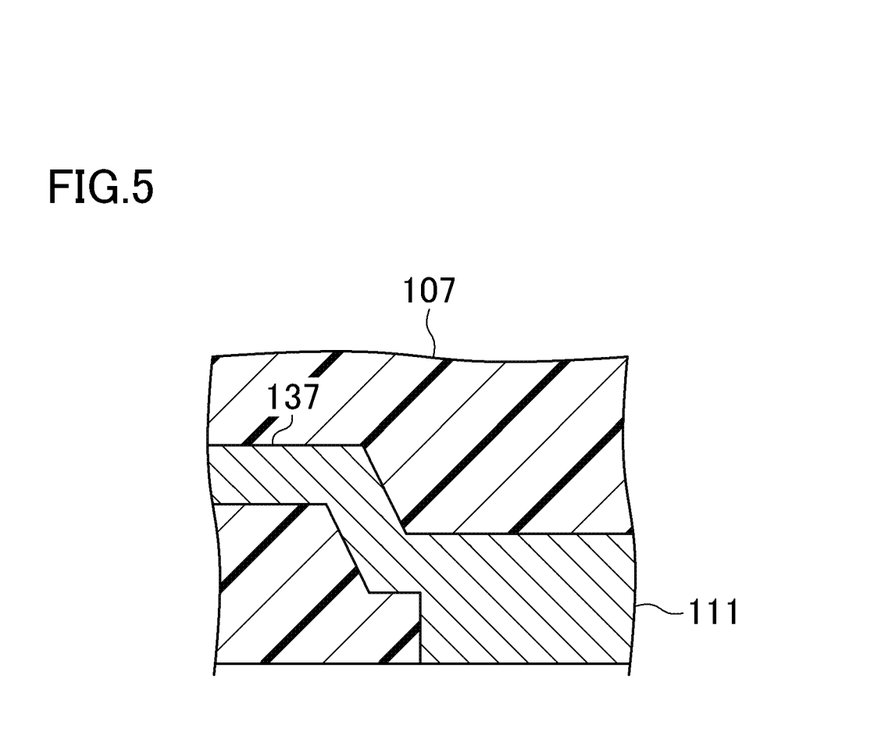
FIG. 5 is an enlarged cross-sectional view of a portion of a lead terminal.

Not only the spacing between each lead terminal and the die pad 111, but also the spacing between each lead terminal and the fifth lead 125 connected to the die pad 111 is important. When the leads and the die pad 111 are placed on different planes, the fifth lead 125 is connected to the die pad 111 via the lead joint 137 as shown in FIG. 5. In the placement shown in FIG. 1, spacing b1 between the lead joint 137 and the second lead terminal 132 and spacing b2 between the lead joint 137 and the fourth lead terminal 134 are preferably as large as possible from the standpoint of the withstand voltage.

The overall withstand voltage of the semiconductor device depends on the spacing between the leads, the spacing between each lead terminal and the die pad, and the spacing between each lead terminal and the lead joint. In the area of the lead terminals, which is covered with the sealing resin, it is easier to secure the withstand voltage than in the area of the leads that is exposed to the air. Therefore, spacing may be determined as follows.

When the spacing g between each of the first to fourth lead terminals 131-134 and the die pad 111 is larger than the spacing b between the lead terminal closest to the lead joint 137 and the lead joint 137, expression (1) below may be satisfied.

$$b \geq B/(S2/S1) \qquad (1)$$

where B is the spacing between the lead closest to the fifth lead 125 and the fifth lead 125, S1 is the dielectric strength of the air, and S2 is the dielectric strength of the sealing member. In FIG. 1, the spacing b is the spacing b1 between the second lead terminal 132 and the lead joint 137, and the spacing B is the spacing B1 between the second lead 122 and the fifth lead 125.

When the spacing g between each of the first to fourth lead terminals 131-134 and the die pad 111 is smaller than the spacing b between the lead terminal closest to the lead joint 137 and the lead joint 137, expression (2) below may be satisfied.

$$g \geq B/(S2/S1) \qquad (2)$$

The first to fourth lead terminals 131-134 normally have the same spacing from the die pad 111. In the case of reducing the spacing between any one of the lead terminals and the die pad 111 due to special design, etc., the spacing between such a lead terminal and the die pad 111, which is narrowest, may satisfy expression (2).

In other words, both the spacing g between each of the first to fourth lead terminals 131-134 and the die pad 111 and the spacing b between the lead terminal closest to the lead joint 137 and the lead joint 137 may be set to be larger than B/(S2/S1). Note that this applies, not only in the case that the spacing h between each of the first to fourth lead terminal 131-134 and the die pad 111 in the direction vertical to the element mount surface is larger than the spacing d therebetween in the direction horizontal to the element mount surface, but also in the case that the spacing h in the vertical direction is smaller than the spacing d in the horizontal direction.

The dielectric strength Si of the air is generally about 1 kV/mm although it varies with the humidity, etc. The dielectric strength S2 of a halogen-free resin used as the sealing member 107 is about 10 kV/mm to about 20 kV/mm. Assuming that S2/S1 is 15 and the spacing B1 is 1.7 mm, for example, the spacing b and the spacing g are preferably 0.12 mm or more. If the spacing b is excessively small, filling of the resin for formation of the sealing member 107 will become difficult. Therefore, the spacing b should preferably be seven-tenths or more of thickness t of the lead terminals. Also, the spacing g may be seven-tenths or more of the thickness t of the lead terminals, and even both the spacing b and the spacing g may be seven-tenths or more of the thickness t of the lead terminals.

For example, assuming that the thickness t of the lead terminals is 0.6 mm, the spacing between any lead terminal adjoining to the lead joint 137 and the lead joint 137 and the spacing between each of the lead terminals and the die pad 111 are preferably 0.3 mm or more. By placing the lead terminals, the lead joint 137, and the die pad 111 as described above, a dielectric strength of about 6.0 kV or more can be easily secured.

In FIG. 1, the first lead group 127 and the second lead group 128 are placed symmetrically with respect to the fifth lead 125. With this symmetrical placement, design of the wiring for connecting the semiconductor element 102 to the lead terminals is easy. However, the fifth lead 125 is not necessarily placed in the center of the package. For example, as shown in FIG. 6, the fifth lead 125 may be placed at an end of the package, and the second lead 122, the first lead 121, the fourth lead 124, and the third lead 123 may be placed in this order from the fifth-lead side of the package.

In the above case, also, the spacing b and the spacing g may be set to satisfy expression (1) and expression (2). In FIG. 6, the spacing b between the lead terminal closest to the lead joint 137 and the lead joint 137 is the spacing b1 between the lead joint 137 and the second lead terminal 132, and the spacing B between the lead closest to the fifth lead 125 and the fifth lead 125 is the spacing B1 between the fifth lead 125 and the second lead 122.

Figure 6:
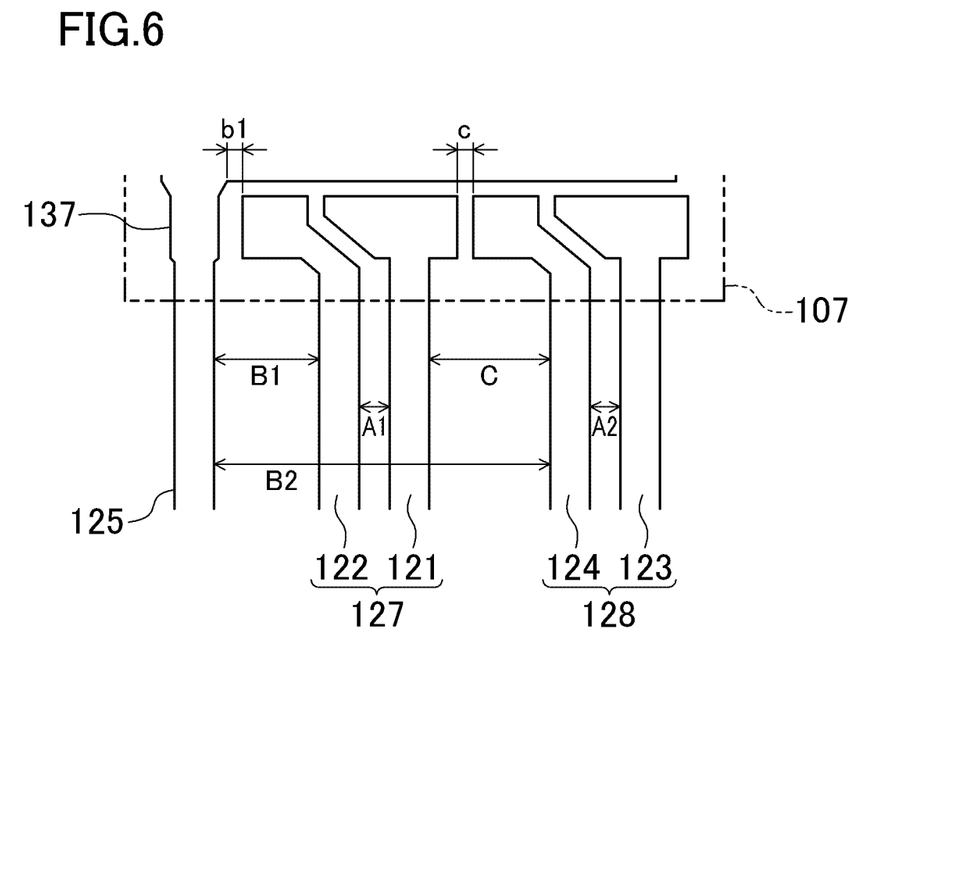
FIG. 6 is a plan view showing a variation of placement of leads.

When the first lead group 127 and the second lead group 128 are placed adjoining to each other as shown in FIG. 6, spacing C between the first and second lead groups 127 and 128 and spacing c between the corresponding lead terminals are also important. The spacing C is made larger than the spacing between the first lead 121 and the second lead 122 and the spacing between the third lead 123 and the fourth lead 124. In particular, expression (3) below should preferably be satisfied.

$$c \geq C/(S2/S1) \quad (3)$$

In FIG. 6, the spacing C is the spacing between the first lead 121 and the fourth lead 124, and the spacing c is the spacing between the first lead terminal 131 and the fourth lead terminal 134. If the positions of the first and second leads 121 and 122 are interchanged, the spacing C will be the spacing between the second lead 122 and the fourth lead 124, and the spacing c will be the spacing between the second lead terminal 132 and the fourth lead terminal 134. Similarly, if the positions of the third and fourth leads 123 and 124 are interchanged, the spacing C will be the spacing between the first lead 121 and the third lead 123, and the spacing c will be the spacing between the first lead terminal 131 and the third lead terminal 133. Both the interchange between the positions of the first and second leads 121 and 122 and the interchange between the positions of the third and fourth leads 123 and 124 may be performed. Also, the second lead group 128 may be placed closer to the fifth lead 125 than the first lead group 127. In this case, also, appropriate placement may be made to establish similar relationship.

The number and diameter of the first wires 141, and the third wires 143, may be changed appropriately according to the required allowable current. For example, two thick metal wires having a diameter of about 350 μm may be used. The diameter of the second wire 142 and the fourth wire 144 may be selected appropriately in the range of about 25 μm to about 200 μm according to the allowable current. As the first and third wires 141 and 143, thick aluminum wires are generally used in consideration of the allowable current. Use of thick aluminum wires that are rigid is advantageous in, not only that the number of wires can be reduced, but also that wires are less likely to cause disconnection due to resin sealing. The second and fourth wires 142 and 144 may be of the same material as the first and third wires 141 and 143, to unify the process. If gold is used for the second and fourth wires 142 and 144, the leads and the lead terminals should preferably be plated with silver to a thickness of about 2 μm.

Some degree of spacing is necessary for wire bonding. Therefore, the length of the first and third wires 141 and 143 should preferably be about 3.5 mm or more, and the length of the second and fourth wires 142 and 144 should preferably be about 2 mm or more. To attain this, it is preferable to adjust the placement of the region of the die pad 111 on which the semiconductor element 102 is mounted and the placement of the first to fourth terminals 151-154 of the semiconductor element 102. To allow the semiconductor element 102 mounted to occupy a region as large as possible and the first to fourth wires 141-144 to be long enough to permit stable wiring, the first to fourth lead terminals 131-134 are preferably placed at positions not overlying the surface of the die pad 111 on which the semiconductor element 102 is mounted. By this placement, a jig required for wire bonding can be placed under the first to fourth lead terminals 131-134, permitting stable bonding.

Although depending on the size of the semiconductor element 102, the first and second terminals 151 and 152 and the third and fourth terminals 153 and 154 are preferably placed on the opposite edges of the terminal formation surface of the semiconductor element 102. In general, preferably, the widths of the terminals are at least 1.5-2 times as large as the diameter of the wire bonded, and the lengths of the terminals are at least 2.5-3 times as large as the diameter of the wire bonded. Thus, assuming that the first and third wires 141 and 143 have a diameter of about 350 μm, the first and third terminals may have a width of at least about 0.6 mm and a length of at least about 1.0 mm.

The first terminal 151 and the second terminal 152 are preferably placed in a line along the first side of the semiconductor element 102, and the third terminal 153 and the fourth terminal 154 are preferably placed in a line along the second side opposed to the first side. Also, preferably, the second terminal 152 and the fourth terminal 154 are formed in the corners of the terminal formation surface closer to the second lead terminal 132 and the fourth lead terminal 134, respectively. With the placement of the terminals as described above, the lengths of the first and third wires 141 and 143 can be made substantially the same, and the lengths of the second and fourth wires 142 and 144 can be made substantially the same. This makes it possible to stabilize the operation at the time of bidirectional switching. Also, since the aspect ratio of the semiconductor element can be reduced compared with the conventional case, an advantage of stabilizing the fabrication process is also expected.

Figure 7:
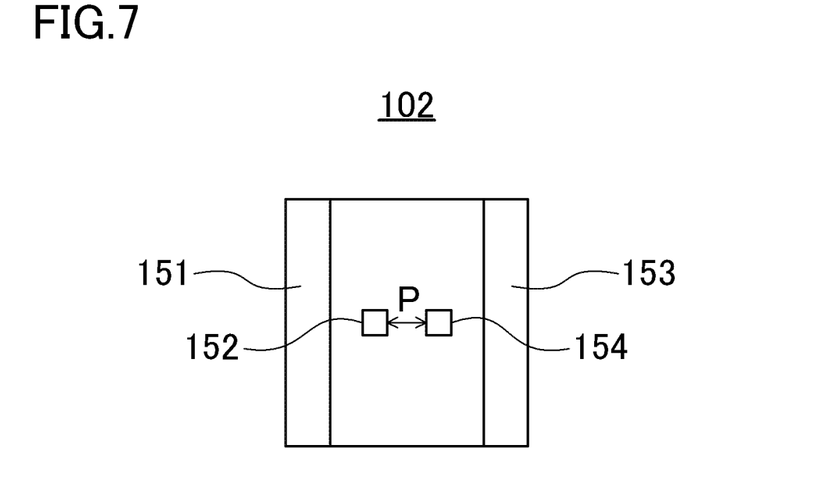
FIG. 7 is a plan view showing a variation of the configuration of the semiconductor element.

It is not necessarily required to place the first and second terminals 151 and 152, and the third and fourth terminals 153 and 154, in a line. For example, as shown in FIG. 7, the first terminal 151 may be formed along the first side, the third terminal may be formed along the second side, and the second and fourth terminals 152 and 154 may be formed at positions, apart from each other, somewhere between the first terminal 151 and the third terminal 153. This placement can secure larger spacing between the second terminal 152 and the second lead terminal 132 and between the fourth terminal 154 and the fourth lead terminal 134 than the placement shown in FIG. 3. This is therefore especially useful when thick aluminum wires having a diameter of 100 μm or more are used as the second wire 142 for connecting the second terminal 152 to the second lead terminal 132 and the fourth wire 144 for connecting the fourth terminal 154 to the fourth lead terminal 134.

In the placement shown in FIG. 7, spacing P between the second terminal 152 and the fourth terminal 154 may be twice or more as large as the diameter of the second and fourth wires 142 and 144. The spacing between the second and fourth terminals 152 and 154 and a third side of the semiconductor element closer to the lead terminals may be set to any value. It is however preferable to set the second terminal 152 and the fourth terminal 154 at positions where the spacing between the second terminal 152 and the second lead terminal 132 and the spacing between the fourth terminal 154 and the fourth lead terminal 134 are 14 times or more as large as the diameter of the second wire 142 and the fourth wire 144. Note however that, when thin gold wires having a diameter of about 25 μm to 50 μm are used as the second and fourth wires 142 and 144, a spacing of about 2 mm should preferably be secured. Having such spacing, the length of the second and fourth wires 142 and 144 can be made large enough to permit easy wiring.

The potential of the fifth lead 125 is equal to the potential of the back terminal of the semiconductor element 102 that is a switch node voltage. Therefore, in order to make effective use of the above structure inside the sealing resin, to secure uniformity in the placement of the lead terminals and the placement of the terminals of the semiconductor element required to allow the device to function as a bidirectional switch, and satisfy the spacing between the lead terminals required to secure the dielectric strength, it is preferable to place the fifth lead 125 in the center of the package. The other leads may be placed symmetrically with respect to the fifth lead 125 with an insulative distance secured from each other. With this placement, the wire connection can be short and at equal intervals, permitting efficient implementation of a small package.

Figure 8:
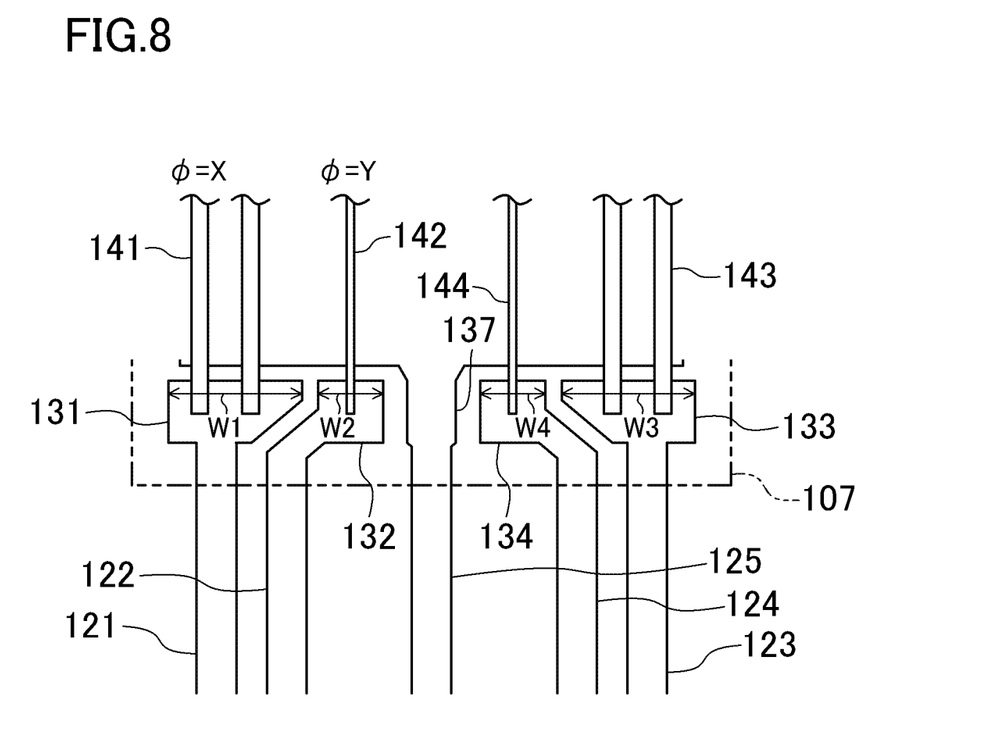
FIG. 8 is a plan view showing an example of bonding of lead terminals with wires.

Not only the terminals of the semiconductor element 102 but also the corresponding lead terminals should preferably have optimal sizes. In general, the width of a lead terminal is about twice as large as the wire diameter when one wire is used, and it is about three times as large as the wire diameter when two wires are used. Therefore, when two first metal wires 141 and two third metal wires 143 are used as shown in FIG. 8, the width W1 of the first lead terminal 131 and the width W3 of the third lead terminal 133 may be about three times as large as diameter X of the metal wires. Also, when one second metal wire 142 and one fourth metal wire 144 are used, the width W2 of the second lead terminal 132 and the width W4 of the fourth lead terminal 134 may be about twice as large as diameter Y of the metal wire. Since a thinner metal wire than the first wires 141 and the third wires 143 can be used as the second wire 142 and the fourth wire 144, the width W2 of the second lead terminal 132 and the width W4 of the fourth lead terminal 134 can be made small compared with the width W1 of the first lead terminal 131 and the width W3 of the third lead terminal 133.

As the sealing member 107, a resin having a dielectric strength of about 10 kV/mm to about 20 kV/mm, such as an epoxy resin, may be used. Not only resins but also other insulative materials may be used. The sealing member 107 may cover at least the semiconductor element 102, the wires, and the lead terminals. Thus, both surfaces of the die pad 111 may be covered, or the surface (back surface) opposite to the surface on which the semiconductor element 102 is mounted (top surface) may be exposed. Otherwise, part of the top surface of the die pad 111 may be exposed. In the case of exposing part of the top surface, a groove may be formed on the top surface of the die pad 111. Having such a groove, the contact area of the die pad with the sealing member increases, whereby detachment of the die pad from the sealing member can be reduced, permitting implementation of a package with high reliability.

Figure 9:
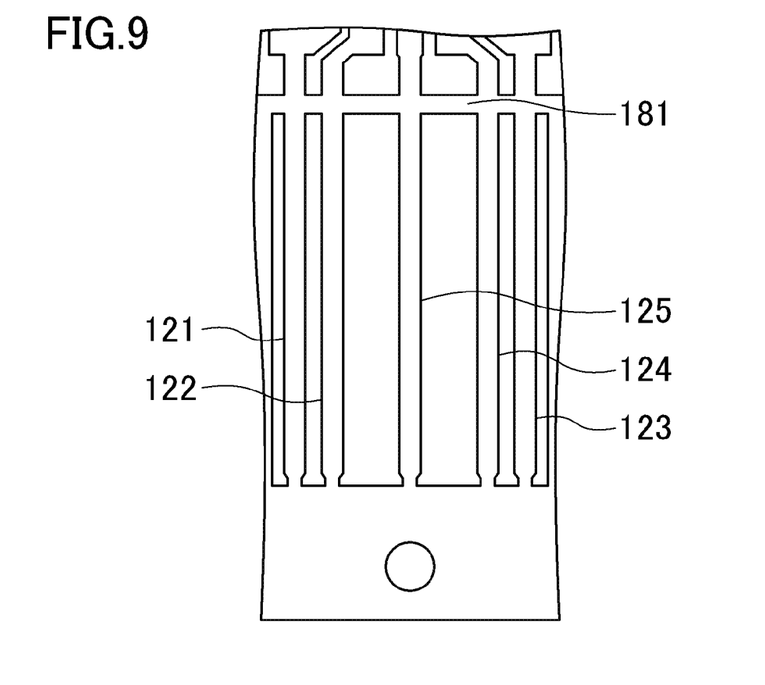
FIG. 9 is a plan view showing a lead frame used in a semiconductor device of an embodiment.

Next, the lead frame used at the time of formation of the semiconductor device will be described. Until the formation of the sealing member 107, the first to fifth leads 121-125 must be kept connected to one another as shown in FIG. 9. A tie bar 181 is formed at a position of the lead frame 101 apart about 0.7 mm from the boundary of the region to be covered with the sealing member 107 toward the tips of the first to fifth leads 121-125. The tie bar 181, having a width of about 0.6 mm, extends in the direction crossing the first to fifth leads 121-125 to connect the first to fifth leads 121-125 to one another. After the insulation sealing, the tie bar 181 is cut off and removed, to allow the first to fifth leads 121-125 to be electrically isolated from one another.

Figure 10:
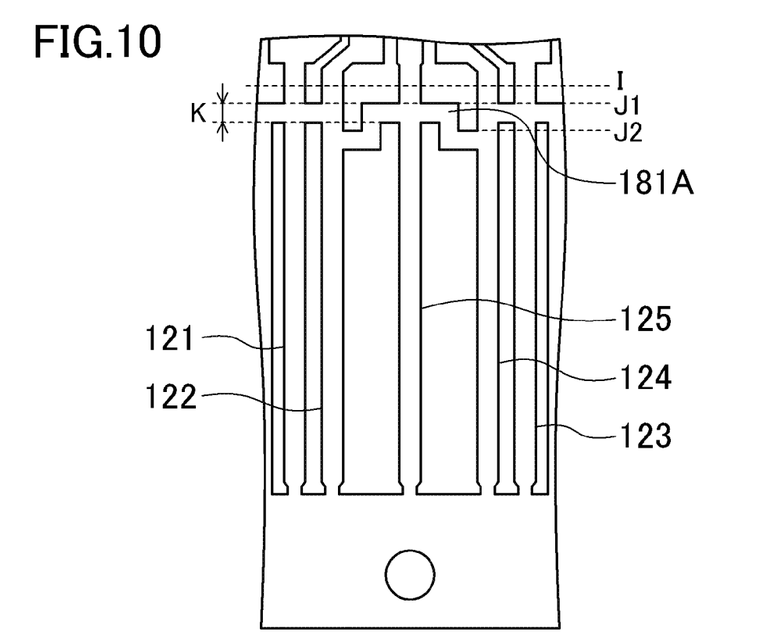
FIG. 10 is a plan view showing a variation of the lead frame used in a semiconductor device of an embodiment.

If a portion of the tie bar 181 is left over at the removal of the tie bar 181, the minimum distance between the leads will become short. When the pitch is 2.54 mm, the minimum clearance can be about 1.7 mm as far as the tie bar 181 is removed with normal precision. For the minimum clearance of 1.7 mm, the dielectric strength will be 2.5 kV or more according to the report on the placement satisfying the minimum clearance for the insulation coordination described in IEC 60664-1 Ed1.0-1992-10. When a dielectric strength of 2.5 kV or more is required, a tie bar 181A having a shape as shown in FIG. 10 may be used. As shown in FIG. 10, the joint position of the tie bar 181A with the fifth lead 125 is deviated from the joint position thereof with the second lead 122 or the fourth lead 124. The tie bar 181A joins with the fifth lead 125 at position J1 apart about 0.7 mm from boundary I of the region of the lead frame 101 to be covered with the sealing resin toward the tip of the fifth lead 125. The tie bar 181A also joins with the second lead 122 or the fourth lead 124 at position J2 apart about 1.3 mm from the boundary I of the region of the lead frame 101 to be covered with the sealing resin toward the tip of the second or fourth lead 122 or 124. As far as the distance between the positions J1 and J2 is larger than the width K of the tie bar 181A, cut faces of the tie bar 181A are avoided from facing each other. Therefore, this configuration is less affected by the cutting precision of the tie bar 181A, and thus reduction of the spacing can be made smaller, than the configuration of the linearly extending tie bar shown in FIG. 9.

In this embodiment, the TO-220 package has been described as an example. Similar advantages can also be obtained for a single inline package, etc. by configuring such a package in a similar way.

When the semiconductor element 102 is a horizontal nitride semiconductor element that includes a channel layer and a cap layer larger in bandgap than the channel layer formed on a substrate and has a channel region through which electrons run in a direction parallel to the principal plane of the substrate, it is preferable to form a semiconductor layer larger in bandgap than the channel layer between the substrate and the channel layer. Having such a semiconductor layer, the dielectric strength of the semiconductor element can be improved even when the back terminal connected to the sources is provided on the back surface of the substrate.

As described above, according to the present disclosure, a small-sized semiconductor device that satisfies the clearance required to secure the dielectric strength and allows flow of a large current can be implemented. Thus, the example semiconductor device and the lead frame thereof are useful, in particular, as a bidirectionally switchable semiconductor device and a lead frame thereof.

What is claimed is:

1. A semiconductor device, comprising:
    a semiconductor element including a first terminal, a second terminal, a third terminal, and a fourth terminal formed on a terminal formation surface and a back terminal formed on a surface opposite to the terminal formation surface;
    a lead frame including a die pad having an element mount surface on which the semiconductor element is mounted and a first lead, a second lead, a third lead, a fourth lead, and a fifth lead placed parallel to one another; and
    a sealing member covering the semiconductor element,
    wherein
    the first lead is connected to the first terminal,
    the second lead is connected to the second terminal,
    the third lead is connected to the third terminal,
    the fourth lead is connected to the fourth terminal,
    the fifth lead is connected to the back terminal via the die pad,
    the first lead and the second lead are placed adjoining to each other and constitute a first lead group,
    the third lead and the fourth lead are placed adjoining to each other and constitute a second lead group,
    the spacing between the first lead group and the fifth lead, the spacing between the second lead group and the fifth lead, and the spacing between the first lead group and the second lead group are larger than the spacing between the first lead and the second lead and the spacing between the third lead and the fourth lead,
    the lead frame includes a first lead terminal, a second lead terminal, a third lead terminal, and a fourth lead terminal respectively provided at ends of the first lead, the second lead, the third lead, and the fourth lead closer to the die pad and a lead joint connecting the fifth lead to the die pad, the first lead terminal, the second lead terminal, the third lead terminal, the fourth lead terminal, and the lead joint are covered with the sealing member, and spacing b between a lead terminal, among the first lead terminal, the second lead terminal, the third lead terminal, and the fourth lead terminal, closest to the lead joint and the lead joint, spacing g between a lead terminal, among the first lead terminal, the second lead terminal, the third lead terminal, and the fourth lead terminal, closest to the die pad and the die pad, spacing B between a lead, among the first lead, the second lead, the third lead, and the fourth lead, closest to the fifth lead and the fifth lead satisfy expression (1):

$$b \geq B/(S2/S1) \text{ and } g \geq B/(S2/S1) \tag{1}$$

where S1 is a dielectric strength of the air, and S2 is a dielectric strength of the sealing member.

2. The semiconductor device of claim 1, wherein the spacing b is seven-tenths or more of a thickness of the first lead terminal, the second lead terminal, the third lead terminal, and the fourth lead terminal.

3. The semiconductor device of claim 1, wherein the spacing g is seven-tenths or more of a thickness of the first lead terminal, the second lead terminal, the third lead terminal, and the fourth lead terminal.

4. The semiconductor device of claim 1, wherein the spacing between each of the first lead terminal, the second lead terminal, the third lead terminal, and the fourth lead terminal and the die pad in a direction vertical to the element mount surface is larger than the spacing between each of the first lead terminal, the second lead terminal, the third lead terminal, and the fourth lead terminal and the die pad in a direction horizontal to the element mount surface.

5. The semiconductor device of claim 1, wherein
the second lead group is placed opposite to the fifth lead with respect to the first lead group,
spacing c as the narrowest distance between a group of the first and second lead terminals and a group of the third and fourth lead terminals and spacing C between the first lead group and the second lead group satisfy expression (2):

$$c \geq C/(S2/S1) \tag{2}$$

where S1 is a dielectric strength of the air, and S2 is a dielectric strength of the sealing member.

6. The semiconductor device of claim 1, wherein
the semiconductor element is of a rectangular plane shape having a first side and a second side opposite to each other, and
the first terminal and the second terminal are formed along the first side, and the third terminal and the fourth terminal are formed along the second side.

7. The semiconductor device of claim 1, wherein
the semiconductor element is of a rectangular plane shape having a first side and a second side opposing to each other,
the first terminal is formed along the first side, the third terminal is formed along the second side,
the second terminal and the fourth terminal are formed at positions, apart from each other, somewhere between the first test sinal and the third terminal,
the spacing between the second terminal and the fourth terminal is twice or more as large as the diameter of a wire connecting the second terminal to the second lead terminal and a wire connecting the fourth terminal to the fourth lead terminal, and the second terminal and the fourth terminal are placed at positions where a distance between the second terminal and the second lead terminal and a distance between the fourth terminal and the fourth lead terminal are 14 times or more as large as a diameter of the wires.

8. The semiconductor device of claim 6, wherein
the first lead group and the second lead group are placed opposite to each other with respect to the fifth lead,
the semiconductor element is mounted on the die pad so that the direction of extension of the first side and the second side is parallel to the direction of extension of the first to fifth leads,
the first side is on the same side as the first lead group, and
the second side is on the same side as the second lead group.

9. The semiconductor device of claim 8, wherein
the second lead is placed closer to the fifth lead than the first lead, and
the fourth lead is placed closer to the fifth lead than the third lead.

10. The semiconductor device of claim 6, wherein
a length of the wire connecting the first terminal to the first lead is equal to the length of the wire connecting the third terminal to the third lead, and
a length of the wire connecting the second terminal to the second lead is equal to the length of the wire connecting the fourth terminal to the fourth lead.

11. The semiconductor device of claim 1, wherein
the semiconductor element is a bidirectional switch,
the first terminal is a first power terminal of the bidirectional switch,
the second terminal is a first control terminal of the bidirectional switch,
the third terminal is a second power terminal of the bidirectional switch, and
the fourth terminal is a second control terminal of the bidirectional switch.

12. The semiconductor device of claim 11, wherein
the bidirectional switch includes a first field effect transistor and a second field effect transistor, and the first and second field effect transistors have a first semiconductor layer and a second semiconductor layer larger in bandgap than the first semiconductor layer formed on a substrate, and also have a first source electrode, a first gate electrode, a first drain electrode, a second source electrode, a second gate electrode, and a second drain electrode formed on the second semiconductor layer,
the first source electrode and the second source electrode are connected to the back terminal,
the first drain electrode is connected to the first power terminal,
the first gate electrode is connected to the first control terminal,
the second drain electrode is connected to the second power terminal, and
the second gate electrode is connected to the second control terminal.

13. The semiconductor device of claim 1, wherein:
the sealing member covers part of the first, second, third, and fourth leads, and
at least part of a surface of the die pad opposite to the element mount surface is not covered with the sealing member.

14. The semiconductor device of claim 13, wherein the die pad functions as a heatsink.

15. The semiconductor device of claim 14, wherein the semiconductor element is mounted to the die pad using a solder material.

16. The semiconductor device of claim 1, wherein:
the sealing member covers part of the first, second, third, and fourth leads, and
the die pad has a groove surrounding a region on which the semiconductor element is mounted.

17. The semiconductor device of claim 1, wherein:
the sealing member covers part of the first, second, third, and fourth leads, and
the die pad has a groove formed on the element mount surface, and the groove is formed in a region of the die pad covered with the sealing member to extend parallel to a boundary between the region covered with the sealing member and an uncovered region.

* * * * *